United States Patent [19]

Maroni

[11] Patent Number: 5,079,223
[45] Date of Patent: Jan. 7, 1992

[54] METHOD OF BONDING METALS TO CERAMICS

[75] Inventor: Victor A. Maroni, Naperville, Ill.

[73] Assignee: Arch Development Corporation, Chicago, Ill.

[21] Appl. No.: 566,780

[22] Filed: Aug. 14, 1990

Related U.S. Application Data

[62] Division of Ser. No. 286,238, Dec. 19, 1988, Pat. No. 5,010,053.

[51] Int. Cl.$^5$ ............................................. C23C 14/34
[52] U.S. Cl. .................... 505/1; 204/192.17; 204/192.31; 505/706
[58] Field of Search ............... 505/1, 706; 204/192.17, 204/192.24, 192.31, 192.15; 427/38, 39

[56] References Cited

U.S. PATENT DOCUMENTS

| | | | |
|---|---|---|---|
| 3,761,309 | 9/1973 | Schmitter et al. | 204/192.17 X |
| 4,337,133 | 6/1982 | Augis et al. | 204/192.17 |
| 4,464,422 | 8/1984 | Senda et al. | 204/192.31 X |
| 4,963,523 | 10/1990 | Ekin et al. | 204/192.17 X |

OTHER PUBLICATIONS

Ekin et al., "Effect . . . Contacts", Material Res. Soc. Sym. Proc., vol. 99, 1988.
Ginley et al., "Grain . . . System", Mat. Res. Soc. Proceedings of Syn. S., 1987.

*Primary Examiner*—Nam X. Nguyen
*Attorney, Agent, or Firm*—Reinhart, Boerner

[57] ABSTRACT

A method of forming a composite by providing a ceramic capable of having zero electrical resistance and complete diamagnetism at superconducting temperatures, bonding a thin layer of Ag, Au or alloys thereof with the ceramic. Thereafter, there is bonded a first metal to the ceramic surface at a temperature less than about 400° C., and then a second metal is bonded to the first metal at a temperature less than about 400° C. to form a composite wherein the first metal is selected from the class consisting of In, Ga, Sn, Bi, Zn, Cd, Pb, Ti and alloys thereof and wherein the second metal is selected from the class consisting of Al, Cu, Pb and Zn and alloys thereof.

6 Claims, 1 Drawing Sheet

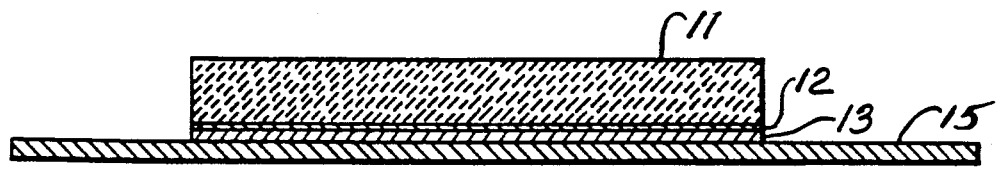
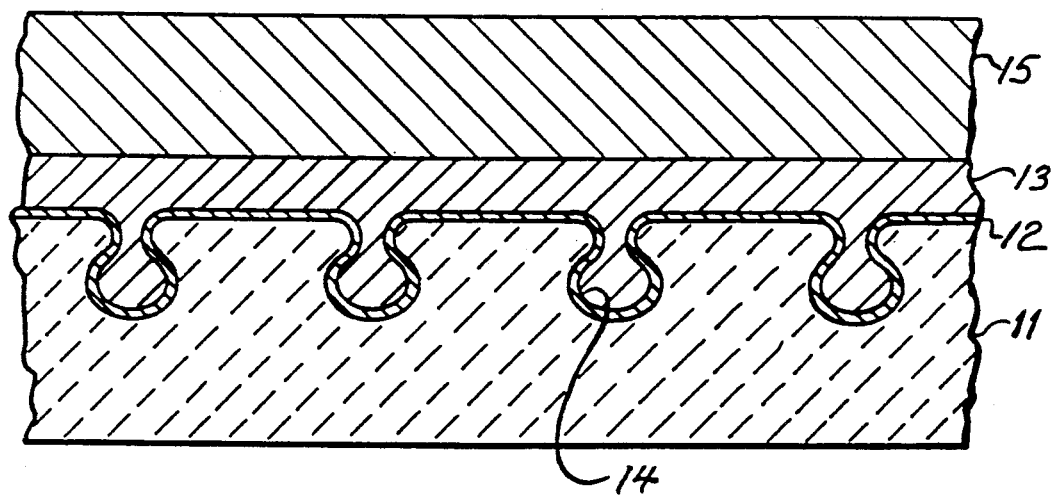
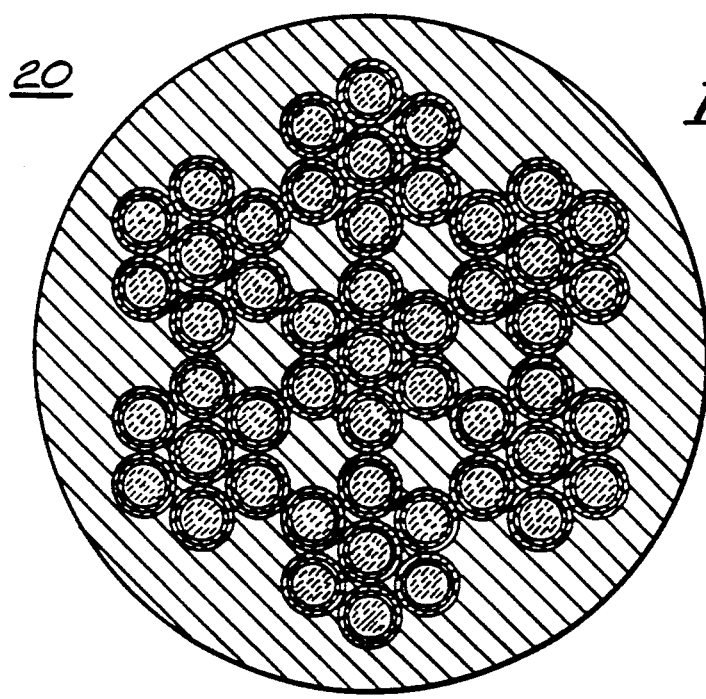

METHOD OF BONDING METALS TO CERAMICS

CONTRACTUAL ORIGIN OF THE INVENTION

This invention was made with Government support under Contract Number W-31-109-ENG-38 awarded by the United States Department of Energy. The Government has certain rights in the invention.

This is a Division of application Ser. No. 286,238, filed Dec. 19, 1988, now U.S. Pat. No. 5,010,053.

BACKGROUND OF THE INVENTION

This invention relates to a composite material consisting of a non-metallic portion and a metallic portion. With the discovery of ceramic superconducting material and particularly with the discovery of ceramic superconducting materials having critical temperatures ($T_c$) higher than the temperature of liquid nitrogen, a flurry of activity has occurred in the scientific community relating to these ceramic materials as well as newly discovered materials and the potential uses for them. Even with elevated $T_c$s, at the present time the state of the superconductor art is such that superconducting materials must be cooled to a significant extent before the onset of superconducting properties, that is the point at which the electrical resistance becomes zero and there is complete diamagnetism. Taking into account the requirement of significant cooling, there will be difficulties in adhering superconducting ceramics to metal substrates due to the differences in the coefficients of expansion of the variant materials as well as thermal shocks created during repetitive thermal cycling between superconducting temperatures and ambient or elevated temperatures. Another significant requirement is that the superconductors be stabilized to provide an alternate current path if the superconductor goes normal. For example, if a portion of the superconductor, due to heat or other change, becomes a semiconductor, a large resistance is interposed in the path of the current carried by the superconductor. To avoid the possibility of explosion or other catastrophic event if the current carried by the superconductor is suddenly disrupted, the superconductor is provided an alternate current path by bonding a good electrical conductor to the superconductor. Hence, the superconductor is "stabilized". It is a further requirement that the interfacial electrical resistivity between the superconductor and the stabilizer be extremely low such that less than 10 watts/cm$^2$ are generated during current shunting.

Various superconductor systems have been investigated including the 1-2-3 system and the 2-2-1-2 system, these respectively being the $YBa_2Cu_3O_x$ system and the $Bi_2Sr_2CaCu_2O_x$ superconductors are ceramics and the bonding of ceramics to metals has heretofore been difficult, if not impossible. There has been prior work involving the use of Li-Cu alloys to bond superconducting ceramics to metals such as copper or aluminum but the early work required relatively high temperatures to achieve bonding between the superconductor and the Li-Cu alloy. I have found that it is advantageous to avoid high temperatures when dealing with certain oxide superconductors since some oxide superconductors can be converted to a semiconductor at its interface with the bonding agent. This results in high electrical resistance at the interface. Another possible problem inherent in the use of lithium is that in contact with an oxide ceramic such as the 1-2-3 superconductor, the lithium tends to react with oxygen and convert the 1-2-3 superconductor to the $YBa_2Cu_3O_6$ phase which is a semiconductor having a high electrical resistance.

Accordingly, it is a principal object of the invention to provide a composite material of a ceramic or glass portion and a metal portion wherein the composite is formed at temperatures less than about 400° C. for instance 150° C. or less using metals which do not react with the ceramic or glass.

Another object of the invention is to provide a method of bonding a metal to a non-metallic such as glass or ceramic at temperatures less than about 400° C.

Another object of the invention is to provide a composite of a ceramic having a layer of silver or gold present at the surface thereof, a first metal bonded to the silver or gold, and a second metal bonded to the first metal.

Still another object of the invention is to provide a stabilized superconducting oxide ceramic having a layer of silver or gold at the surface thereof, a first metal bonded to the layer of silver or gold and a second metal bonded to the first metal, wherein the first metal bonds with the silver or gold atoms at a temperature less than about 400° C. and the first and second metals bond at a temperature less than about 400° C. and said first and second metals are good electrical conductors.

A final object of the invention is to provide a method of forming a composite including providing a ceramic having layer of silver and gold at the surface thereof, bonding a first metal to the layer of silver or gold at the ceramic surface at a temperature less than about 400° C., bonding a second metal to the first metal at a temperature less than about 300° C. to form a three layer composite wherein the first metal is selected from the class consisting of In, Ga, Sn, Bi, Zn, Cd, Pb, Tl and alloys thereof and wherein the second metal is selected from the class consisting of Al, Cu, Pb, Zn and alloys thereof.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

FIG. 1 shows a composite having a metal layer bonded to one surface of a ceramic and a metal substrate bonded to the metal layer FIG. 2 is a schematic representation of a ceramic surface having a metal layer bonded thereto and another metal bonded to the metal layer; and FIG. 3 is a cross-sectional view of a stabilized superconducting cable.

DESCRIPTION OF THE PREFERRED EMBODIMENT

Referring now to FIG. 1, there is disclosed a composite 10 having a non-metallic portion 11. Bonded to one surface of the non-metallic portion 11 is a thin layer of a metal 12 such as silver or gold. The composite 10 consisting of the non-metallic portion 11 and the gold or silver layer 12 is connected to a metal substrate 15 by means of a bonding agent 13 located between the thin layer of silver or gold 12 and the metal substrate 15. The non-metallic portion 11 of the composite 10 may be glass, as hereinafter defined, or ceramic. Glass as used herein is any amorphous non-metal while ceramic as used herein is a non-metal with a well defined crystal structure and may be an oxide, nitride or carbide and includes any high temperature superconducting ceramic.

The layer 12 is thin, from about 300 to about 1000 angstroms and may be deposited by sputtering or ion plating so long as the temperature of the non-metal 11 is not raised in excess of about 400° C. and the silver or gold bonds to the ceramic or glass substrate. Where the non-metal 11 is a ceramic superconductor, it has been found that temperatures in excess of about 200° C. are deleterious to the superconducting properties of certain high Tc superconductors, such as the 1-2-3 system, and can convert part or all of the superconductor to a semiconductor which is electrically resistive. The bonding agent 13 is a metal which forms a stable intermediate phase or a solid solution with the silver or gold 12 at a temperature below about 400° C. Metals which are acceptable as the bonding agent are In, Ga, Sn, Bi, Zn, Cd, Pb and Tl as well as various alloys of each or any of them. The substrate 15 may be any electrically conducting metal to which the bonding agent 13 of the composite 10 forms a stable intermediate phase or solid solution by heat and pressure, so long as the temperature at which the bond is formed is below the temperature at which the superconductor 11 converts to a non-superconducting phase The preferred metal substrate 15 is an electrical conductor such as copper, aluminum, lead, zinc or alloys thereof which act as a stabilizer for the superconductor 11. Since electrical conductivity varies with temperature, some metals which are not good electrical conductors at ambient temperatures will still be acceptable for use with a superconductor at low temperatures in the order of 100° K.

FIG. 2 shows a schematic of the composite 10 hereinbefore described. The ceramic 11 is somewhat porous, typically about 80% dense, and has pores 14 in the surface thereof. The pores 14 provide mechanical bonding for the thin layer 12. To the ceramic 11 is sputtered or ion plated a thin layer 12 of silver or gold and due to cost and time constraints, on the order of about 1000 angstroms. A foil of a first metal 13 is bonded to the layer 12 of silver or gold and thereafter the composite is stabilized by the addition of a suitable conductor 15, such as Cu, Al, Pb, Sn or alloys thereof.

Referring to FIG. 3, there is disclosed a stabilized cable 20 having a plurality of clusters 21 each having a plurality of superconductor strands 22 surrounded by a stabilizer 23 such as Cu, Al, Pb, Zn or alloys thereof. The metal 23 is bonded to the bonding agent 13 as set forth previously which in turn is bonded to a layer 12 of silver or gold bonded to the surface of each superconductor strand 22. The metal 23 serves as a stabilizer to accommodate thermal shock encountered during repetitive thermal cycles occasioned by superconductors having $T_c$s of 95° K. to 105° K. or the like and provides a current path if one or more of the strands of superconductor 22 "go normal" or otherwise lose their superconducting characteristics. The superconductor strands 22 may be elongated circular wires, strips or tapes. Extruding and tape casting are methods used to produce superconducting tapes, strips and wires. In addition, constructions of composites 10 may be used as buss bars or electrical contacts.

Samples of composites 10 have been prepared using an 80% dense 1-2-3 oxide superconductor pellet (12 mm dia., 3 mm thick), with silver sputtered onto the end surfaces. Indium foils of about 5 mils were used to bond to the silver layer at both ends of the pellet under pressure of about 10,000 psi. at a temperature less than 300° C. to a stabilizer of Cu. The time necessary to effect bonds were those approaching continuous processes, and the actual temperatures used were under the melting point of indium (158° C.). In fact, melting the bonding agent is to be avoided to prevent the bonding agent from wicking through the silver into the ceramic. Thereafter, copper was bonded to both sides of the pellet to provide the final test structure. The construction was subjected to tensile forces of 6 kg by hanging weights from holes tapped into the copper segments. Constructions of this type have withstood pulling forces in excess of 100 pounds per square inch.

While there has been disclosed what is considered to be the preferred embodiment of the present invention, it is understood that various changes in the details may be made without departing from the spirit, or sacrificing any of the advantages of the present invention.

I claim:

1. A method of forming a composite comprising the steps of: providing a ceramic capable of having zero electrical resistance and complete diamagnetism at superconducting temperatures, bonding a layer of Ag, Au or alloys thereof with the ceramic, pressure bonding a first metal of In or an alloy thereof the to layer of Ag, Au or alloys thereof at a temperature less than the melting point of the In or In alloy, bonding a second metal to the In or In alloy to form a composite wherein the second metal is selected from the class consisting of Al, Cu, Pb and Zn and alloys thereof.

2. The method of claim 1, wherein the silver or gold layer is deposited by sputtering.

3. The method of claim 2, wherein the sputtered metal is Ag or an alloy thereof and the In or alloy thereof is bonded thereto by positioning a foil of the In or alloy thereof adjacent to the silver layer and subjected same to pressure at a temperature lower than the melting point of the In or alloy thereof and for a time sufficient to bond the In or alloy thereof to the silver layer.

4. The method of claim 3, wherein the In or In alloy is bonded at a pressure of about 10,000 psi.

5. The method of claim 1, wherein the silver or gold layer is deposited by ion plating.

6. The method of claim 1, wherein the ceramic is an oxide, the layer bonded to the ceramic oxide is Ag, and the metal bonded to the In or alloy thereof is Cu, Al and alloys thereof.

* * * * *